US010911269B2

(12) United States Patent
Deka et al.

(10) Patent No.: US 10,911,269 B2
(45) Date of Patent: Feb. 2, 2021

(54) DECISION FEEDBACK EQUALIZER CIRCUIT WITH TRANSISTOR MOBILITY CHANGE COMPENSATION

(71) Applicant: Intel Corporation, Santa Clara, CA (US)

(72) Inventors: Anup J. Deka, Bangalore (IN); Kambiz R. Munshi, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/642,524

(22) Filed: Jul. 6, 2017

(65) Prior Publication Data

US 2019/0013973 A1    Jan. 10, 2019

(51) Int. Cl.
| | |
|---|---|
| H04L 25/03 | (2006.01) |
| H04L 25/06 | (2006.01) |
| H04L 25/08 | (2006.01) |
| H04L 25/10 | (2006.01) |
| H04L 25/02 | (2006.01) |
| H03K 5/00 | (2006.01) |

(52) U.S. Cl.
CPC .... *H04L 25/03057* (2013.01); *H04L 25/0282* (2013.01); *H04L 25/03267* (2013.01); *H04L 25/03949* (2013.01); *H04L 25/06* (2013.01); *H04L 25/08* (2013.01); *H04L 25/10* (2013.01); *H03K 5/00* (2013.01)

(58) Field of Classification Search
CPC ........... H04L 25/03057; H04L 25/0282; H04L 25/06; H04L 25/03949; H04L 25/03267; H04L 25/08; H03K 5/00
See application file for complete search history.

(56) References Cited

U.S. PATENT DOCUMENTS

| | | | |
|---|---|---|---|
| 8,446,173 B1 * | 5/2013 | Faucher | H03K 19/00361 326/27 |
| 9,438,450 B1 | 9/2016 | Kang et al. | |
| 9,542,991 B1 | 1/2017 | Xie et al. | |
| 9,564,863 B1 | 2/2017 | Giridharan | |
| 9,722,820 B1 * | 8/2017 | Hekmat | H04B 1/16 |
| 2005/0135471 A1 | 6/2005 | Tonietto et al. | |
| 2005/0271136 A1 * | 12/2005 | Chung | H04L 25/03146 375/233 |
| 2014/0314173 A1 * | 10/2014 | Hekmat | H04L 25/4919 375/287 |
| 2016/0149656 A1 * | 5/2016 | Levin | H04L 25/03057 375/224 |
| 2016/0380786 A1 | 12/2016 | Goyal et al. | |

OTHER PUBLICATIONS

International Search Report and Written Opinion for PCT Patent Application No. PCT/US2018/2929, dated Aug. 14, 2018, 15 pages.

* cited by examiner

*Primary Examiner* — Sam K Ahn
*Assistant Examiner* — Amneet Singh
(74) *Attorney, Agent, or Firm* — Compass IP Law PC (57) ABSTRACT

An apparatus is described. The apparatus includes a decision feedback equalizer circuit having a summation circuit. The summation circuit has a differential pair that includes first and second transistors coupled to a current source. The current source is to draw a current through the first and second transistors. The decision feedback circuit also includes a circuit to adjust the current to compensate for a change in electron mobility of at least one transistor of the current source.

15 Claims, 8 Drawing Sheets

DECISION FEEDBACK EQUALIZER CIRCUIT WITH TRANSISTOR MOBILITY CHANGE COMPENSATION

FIELD OF THE INVENTION

The field of invention pertains generally to the electronic arts, and, more specifically, to a decision feedback equalizer circuit with temperature invariant ISI equalization achieved through transistor mobility change compensation.

BACKGROUND

Designers of high speed receiver circuits face the challenge of designing circuits that are able to accurately reconstruct received data even though the quality of the received signal generally degrades with each successive transistor technology owing to, e.g., faster clock speeds and correspondingly smaller eye pattern windows. A problem with accurate reproduction of received data is drift or migration of certain properties of one or more of the receiver's constituent transistors. Here, although the receiver may be calibrated at initial power-on/bring-up, such calibration may lose its effectiveness if an underlying transistor property begins to drift or migrate. If the receiver cannot internally address the issue, the larger system will have to contend with higher error rates along the receiver's channel and/or periodically shut down the receiver's channel to recalibrate. Either can be viewed as a decline in the performance of the system.

FIGURES

A better understanding of the present invention can be obtained from the following detailed description in conjunction with the following drawings, in which.

DETAILED DESCRIPTION

Figure 1:
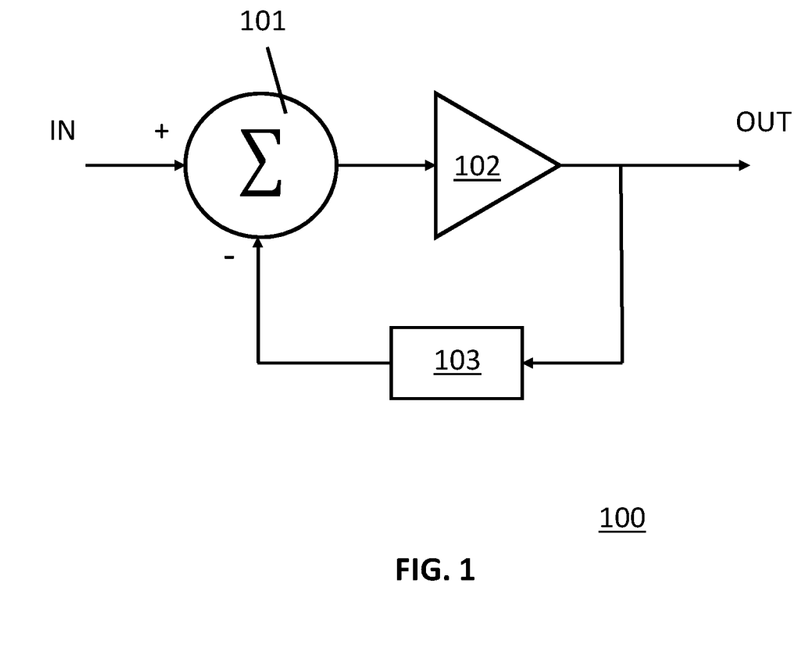
FIG. 1 shows a high level view of a decision feedback analyzer circuit.

FIG. 1 shows a high level view of a decision feedback equalizer (DFE) circuit 100. DFE circuits are commonly used at the front end of a high speed receiver. According to the basic operation of the circuit 100, an input signal that includes a series of symbols is provided to a summation circuit 101. The summation circuit 101 subtracts away remnants of one or more symbols that were received by the circuit 100 immediately before the most recently received symbol that has just been presented to the summer circuit 101.

The subtraction of the immediately prior symbols from the newly received symbol removes inter symbol interference (ISI) from the newly received symbol. Here, especially in the case of high speed signals, neighboring symbols (and even more distant symbols) may overlap in time. The overlapping of proximate symbols reduces the integrity of the symbols which can result in bit errors generated by the receiver.

With ISI being at least partially removed from the newly received symbol by the summation circuit 101, a less distorted representation of the newly received symbol is provided to a decision circuit 102. With the decision circuit 102 being provided with a less distorted representation of the signal, the decision circuit is able to make a more accurate decision as to the value of the symbol thereby reducing the overall error rate of the received signal. The newly received symbol is then provided at the decision circuit's output and presented to the input of a feedback channel 103. The feedback channel 103 then applies the symbol (often along with even earlier received symbols) to the summation circuit 101 for the processing of the immediately following symbol.

Figure 2:
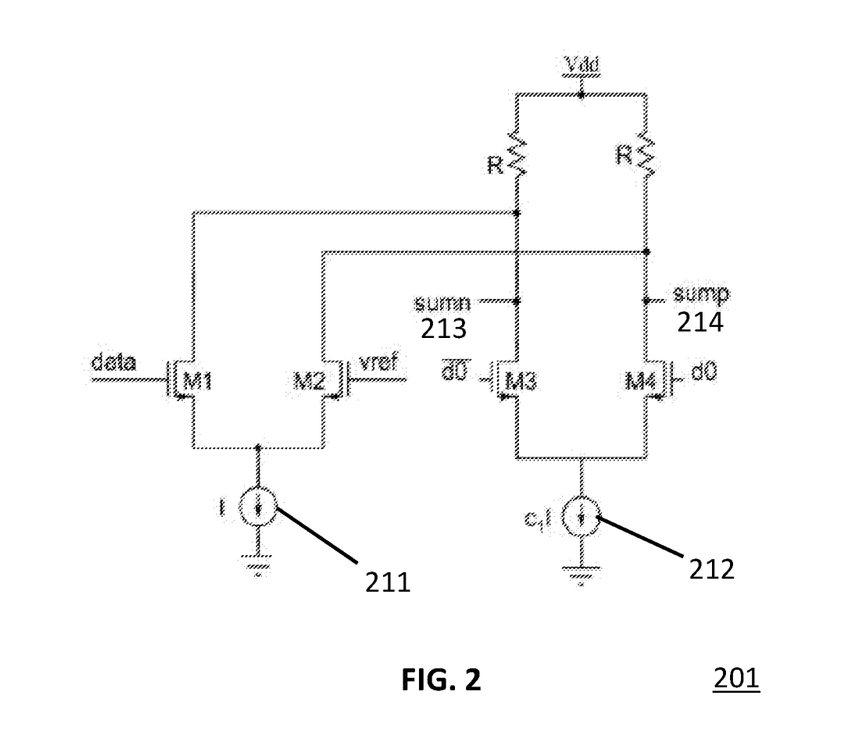
FIG. 2 shows an embodiment of a summation circuit.

FIG. 2 shows a depiction of an embodiment of a summer circuit 201. The summer circuit includes a first differential pair M1, M2 and a second differential pair M3, M4. The input signal is a single ended signal that is received at M1. The first differential pair essentially amplifies the difference between the input signal and a reference voltage Vref that is fixed at M2. The second differential pair receives the feedback signal that represents a previously received symbol. With the load resistances R, R of both differential pairs being shared by the differential pairs, the respective outputs of the differential pairs are effectively added (hence the circuit's summation behavior). Here, the output signal of the summation circuit (presented at output nodes 213, 214) and the feedback signal that is received by the second differential pair are both differential signals.

In an embodiment where only the immediately received symbol (bit value) is provided as feedback, only one second differential pair is present. FIG. 2 offers this perspective where d0 and/d0 correspond to the immediately received bit in differential form. If additional, earlier received symbols/bits are to be fed back to the summation circuit 201, additional differential pairs like the second differential pair can be added having their respective output nodes tied to the sumn and sump output nodes 213, 214 of the summation circuit as depicted in FIG. 2. For simplicity the remainder of the discussion will largely refer to only a single, immediately earlier feedback bit value d0, /d0.

The current through the first differential pair, I, is sunk by a first current source 211 and the current through the second differential pair, $c_i$*I, is sunk by a second current source 212. Here, note that the current that is sunk by the second current source 212 is a function of the current that is sunk by the first current source. The term $c_i$ corresponds to a coefficient that is applied to the feedback signal so as to properly balance the magnitude of the feedback signal and the magnitude of the newly received input symbol.

During, e.g., initial bring-up of the circuit, the circuit is calibrated so as to determine the appropriate coefficient for the feedback signal. The appropriate coefficient is then programmed into the summation circuit (e.g., through register space) and applied to the current source 212 for the second differential pair.

A problem is that the second differential pair behaves more akin to a digital inverter and pulls the full $c_i$*I current through either of its legs in order to introduce the feedback signal, whereas, the first differential pair is more akin to an analog amplifier that alternates current through its legs in proportion to the small signal gain of transistors M1 and M2. As such, the feedback signal has a naturally larger magnitude than the input signal. The setting of the coefficient helps to control the amount of feedback as compared to the input signal so that the distortion caused by previous bits due to ISI is optimally cancelled out.

A problem is that the properties of the M1 and M2 transistors can drift or change in response to, e.g., temperature variations which affects the accuracy of the initial coefficient setting. With a less accurate coefficient setting, the summation circuit 200 is not able to remove ISI as well as it did immediately after calibration. Here, with the first differential pair behaving like an analog differential amplifier, the magnitude of the input signal is proportional to gm*R where gm is the transconductance of transistors M1 and M2. Temperature variation from 0 to 110° can cause the transconductance of transistors M1 and M2 to drop by 30%. With I remaining largely constant over the same temperature variation, the relationship between the magnitude of the received signal and the feedback signal can vary significantly and, likewise, vary the degree to which ISI is removed.

The drift in transconductance with temperature is caused by the change of electron mobility. Mobility characterizes how quickly an electron can move through a semiconductor, when pulled by an electric field. It is known in the art that as temperature increases, thermal vibrations of atoms in a semiconductor increases. The electrons collide with the vibrating atoms and get scattered from their main path which leads to reduced mobility at higher temperature.

Figure 3:
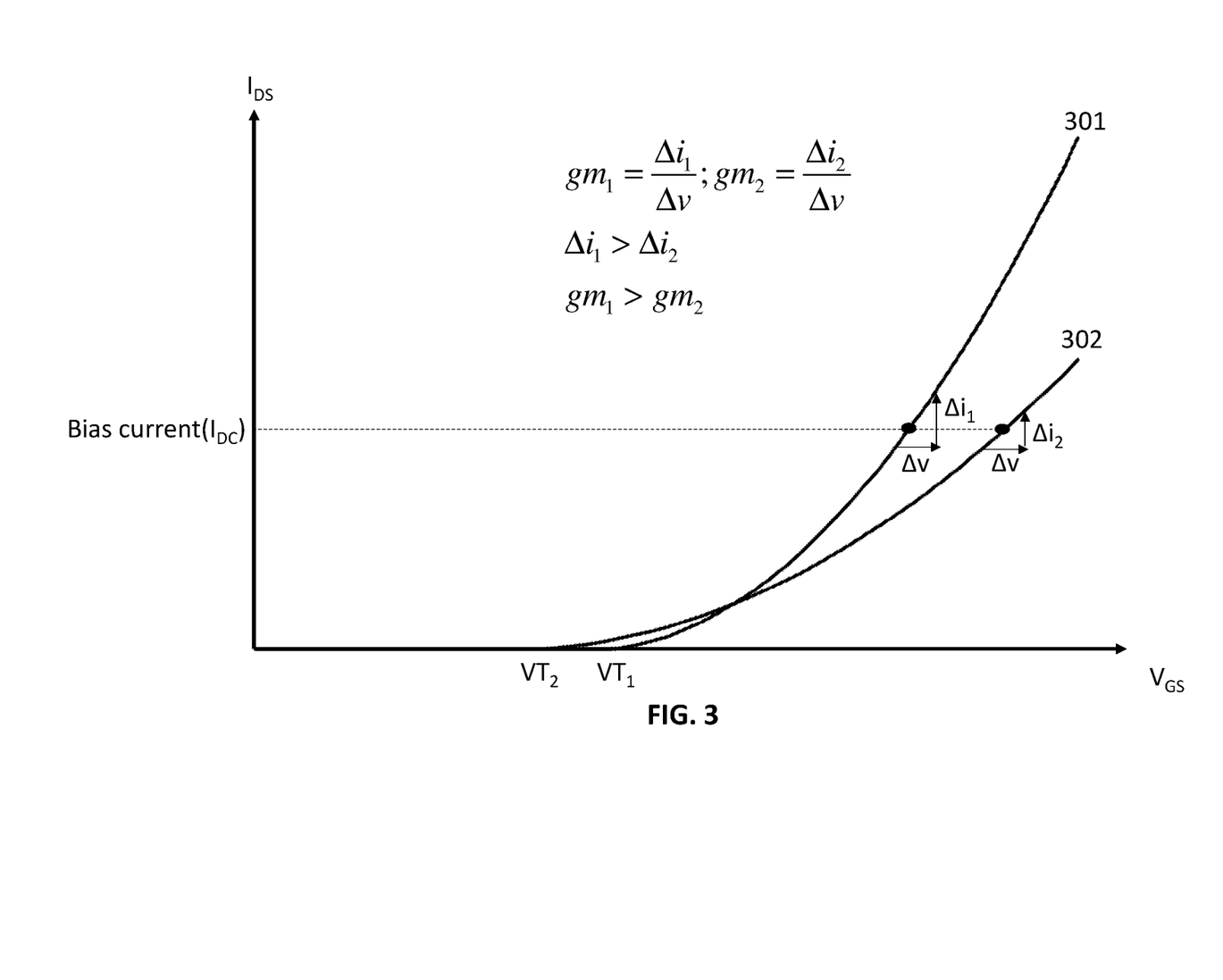
FIG. 3 shows curves for a transistor that demonstrates a change in transconductance.

FIG. 3 shows the IDS vs VGS curves 301, 302 for a transistor in saturation region such as either or both of transistors M1 and M2 of FIG. 2. Specifically, upper curve 301 corresponds to a lower temperature and curve 302 corresponds to a higher temperature. As can be seen from the curves, with a constant bias current $I_{DC}$, when a small signal voltage $\Delta v$ is applied at the gate of the transistor, the upper curve 301 results in a higher small signal current $\Delta i_1$ compared to small signal current $\Delta i_2$ in curve 302. As a result, curve 301 at lower temperature has a higher transconductance ($gm_1$) than that of curve 302 ($gm_2$). The lower transconductance at higher temperature is due to degradation of the electron mobility. Since transconductance of the input differential pair (M1,M2) decreases at higher temperature leading to lower gain (gm*R) of the input signal, the amount of feedback (I*R) should also scale along with the input signal gain for the ISI to be removed optimally across the temperature range.

With the change in ratio of gm to I being at the core of the variation in ISI removal, a solution is to design the summation circuit such that the current I tracks the transconductance gm. That is, gm/I is designed to be constant. As such, a 30% change in gm will be matched by an identical 30% change in the current I.

It can be shown that the ratio gm to I for a transistor in saturation can be expressed as $(\mu/I)^{0.5}$ where $\mu$ is the mobility of the transistors M1, M2. Thus, a design point for a summation circuit having ISI removal that is more immune to temperature variation is $(\mu/I)^{0.5}=(1/K)^{0.5}$ where K is a constant. That is, $\mu/I=1/K$ or $I=K\mu$. Here, the relationship $I=K\mu$ expresses current as being proportional to $\mu$. Thus, a solution is to design a circuit whose source current I for both differential pairs of FIG. 2 is proportional to the mobility $\mu$ of the transistors of the first differential pair. In other words, a mobility tracking bias is to be designed.

As is known in the art, the resistance of a device that is in triode region is a function of two underlying temperature dependent device parameters—mobility of the carriers and the device threshold voltage (VT) that turns the device on. The resistance is inversely proportional to the mobility of the carriers in the device and the overdrive voltage (Vov=VGS−VT). If the device is biased at a constant overdrive voltage (VGS=Vbias+VT or Vov=Vbias), the resistance would be a function of mobility alone and a resistance that inversely tracks mobility is obtained. Here, Vbias is a fixed voltage bias.

Figure 4:
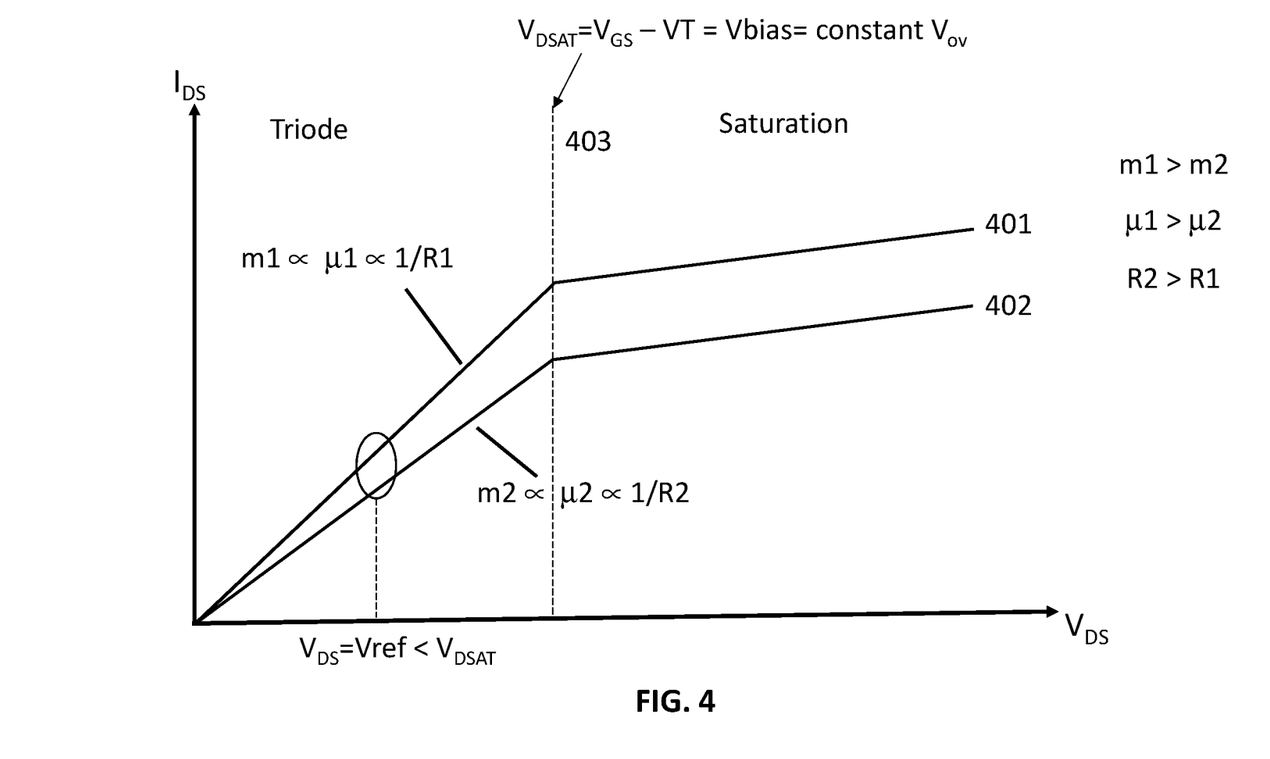
FIG. 4 shows curves for a transistor that demonstrates a change in mobility.

FIG. 4 shows $I_{DS}$ v $V_{DS}$ curves 401, 402 for a transistor biased with a constant overdrive voltage of Vbias. Curves 401 and 402 are for a same applied $V_{ov}$ voltage and demonstrate the change in a transistor's resistance in response to changes in temperature. Specifically, upper curve 401 corresponds to a lower temperature and curve 402 corresponds to a higher temperature. In the device's triode region, which is to the left of the saturation curves 403 and is characterized by a substantial $V_{GS}$ voltage beyond the devices threshold voltage $V_T$ and a low $V_{DS}$ voltage (e.g., $V_{GS}-VT>V_{DS}$ where $V_{GS}>V_T$), the device behaves like a nominal resistance in that $V_{DS}$ changes approximately linearly with an increase in $I_{DS}$. Because resistance in the triode region inversely tracks mobility, at higher temperature when mobility degrades, the resistance increases. As seen in curves 401, 402, the lower temperature curve 401 demonstrates a greater slope m1 in triode mode than the slope m2 of the higher temperature curve 402 in triode region. The channel resistance $$\left(R = \frac{\Delta V}{\Delta I} = 1/m\right)$$

is inversely proportional to the slopes and so the channel resistance R2 of the device at higher temperature is more than the resistance R1 of the device at lower temperature. The respective slopes of the device's lines in triode mode are directly proportional to the mobility of the device's semiconductor channel, where, larger slope corresponds to greater mobility.

Recalling from above that an objective is to design the circuit to behave according to the relationship $I=K\mu$, this same objective can be re-expressed as $I=K*/R$ where $K*$ is the constant K restructured to include terms that translate $\mu$ into R. As such, in order to reduce the degradation of the ISI removal by the summation circuit 201 of FIG. 2, the summation circuit 201 should be designed so that the respective currents that are drawn by its current sources 211, 212 vary inversely with the channel resistance of a transistor.

Figure 5:
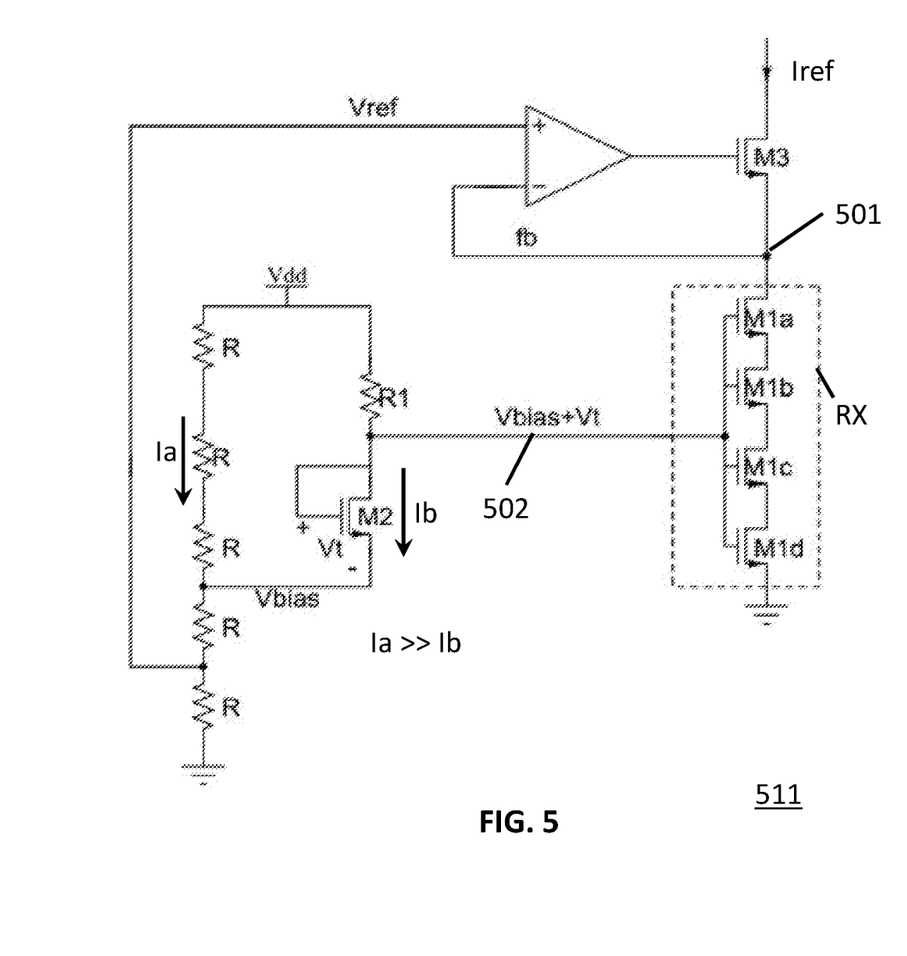
FIG. 5 shows a circuit that is responsive to a change in transistor mobility.

FIG. 5 shows an embodiment of a design for a current source 511 that could be used, e.g., to implement current source 211 of FIG. 2 or to implement a current reference from which the current sources 211, 212 generate their respective currents. Here, the current output $I_{ref}$ corresponds to the current that is drawn by the current source. The $I_{ref}$ current varies inversely with the resistance RX of a series of transistors M1a, M1b, M1c and M1d and therefore varies linearly with the mobility of the transistors' conductive channels. Here, a reference voltage Vref is made to appear at node 501. As such $I_{ref}=Vref/RX$. If Rx decreases due to a temperature increase, $I_{ref}$ will increase in proportion. Likewise, if Rx increases due to a temperature lowering, $I_{ref}$ will decrease in proportion. By throttling $I_{ref}$ in this manner, and throttling the current drawn by current sources 211, 212 in response, the summation circuit better eliminates ISI over a wider temperature range than prior art circuits.

In the current source 511 of FIG. 5, R1 is made much larger than 5R so that very little current Ib flows through M2 as compared to the current Ia that flows through the five series resistances R. With only a small amount of current flowing through R1, the $V_{GS}=V_{DS}$ voltage of M2 will be equal to the threshold voltage Vt of M2. A bias voltage Vbias is taken from the series R resistances and provided to the source of M2. As such, node 502 is set at a voltage of Vbias+Vt. Vbias will behave as a stable voltage, even if the current through M2 varies, because Ia>>Ib.

The combination of the Vbias+$V_T$ voltage at node 502 and Vref at node 501 places the transistors (M1$a$, M1$b$, M1$c$, M1$d$) of RX into the triode region so that their resistance variation is a function of their mobility variation. That is, Vbias+$V_T$ corresponds to a substantial gate voltage that is applied to the transistors of RX and Vref causes each of the transistors of Rx to receive a small $V_{DS}$ voltage. Specifically, Vref=0.4$V_{DD}$ (it is taken from the second of five R resistances). With node 501 being equal to 0.4$V_{DD}$, each of the transistors of Rx have a $V_{DS}$ of 0.1 $V_{DD}$. That is, each of the four transistors of RX consume one fourth of Vref. Thus, each of the transistors of RX receive a substantial gate voltage and a small $V_{DS}$ voltage thereby placing them in the triode region. As such, Iout will vary directly with the mobility of the channels of the transistors of Rx.

Figure 6:
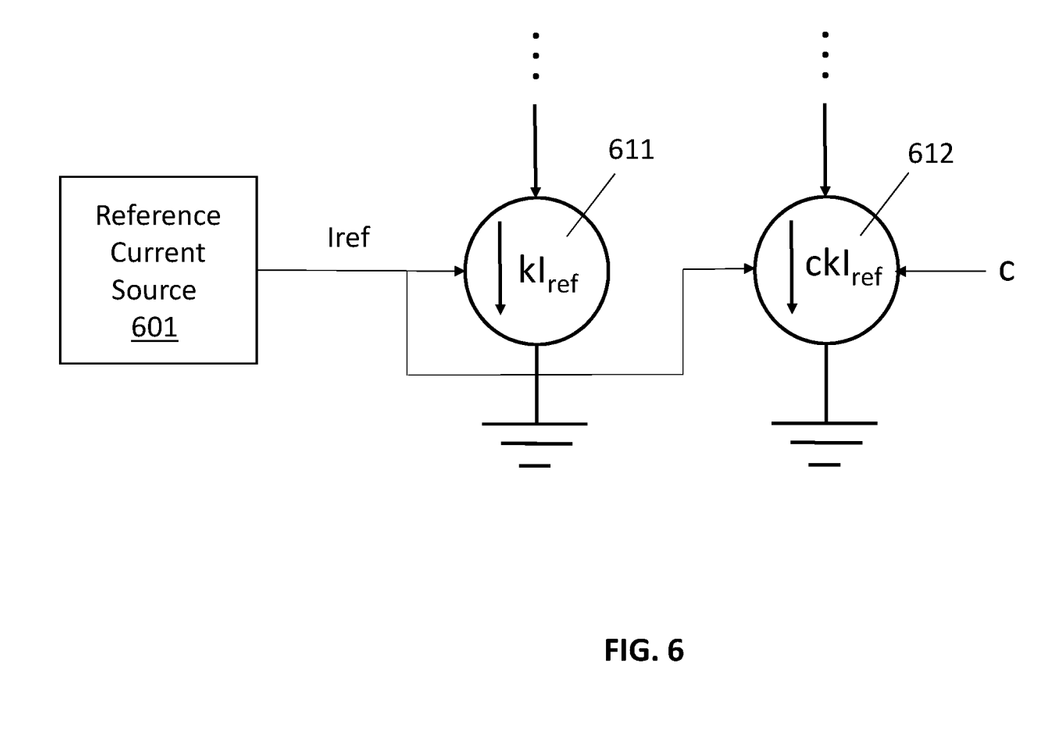
FIG. 6 shows a current source arrangement.

FIG. 6 shows an embodiment of current biasing circuitry that can be integrated into a DFE receiver such as the DFE receiver 100 of FIG. 1. Here, comparing the summation circuit 201 of FIG. 2 with FIG. 6, current source 611 of FIG. 6 can be viewed as current source 211 of FIG. 2 and current source 612 of FIG. 6 can be viewed as current source 212 of FIG. 2.

Referring to FIG. 6, a reference current source 601 generates a reference current Iref that is provided to both of current sources 611, 612. The reference current source 601 is implemented with a circuit, such as the circuit of FIG. 5, that generates a reference current that varies with change in mobility of its constituent transistors. Ideally, the reference current source circuit 601 resides near the current sources 611, 612 on the surface area of the semiconductor chip and includes transistors (particularly, e.g., transistors M1$a$, M1$b$, M1$c$ and M1$d$ of FIG. 5) that have same design as the transistors of the current sources 611, 612 so that for any change in mobility in the transistors of current source 601 there will be an approximately same change in mobility in the transistors of current sources 611 and 612.

Current source 611 is implemented as a current amplifier, e.g., with unity gain (k=1), that amplifies the Iref current. Likewise, current source 612 is also implemented as a current amplifier whose amplification takes into account the coefficient setting c for the feedback path. In various embodiments, as described above, the coefficient setting c is determined once at bring-up/power on of the receiver and is programmed into the DFE receiver (e.g., into register space of the receiver). The register holding the coefficient setting is coupled to current source 612 to effect the correct feedback path coefficient. As described above, in alternate embodiments, more than one feedback path and/or prior symbol may be feedback to the summation circuit each having its own coefficient, corresponding current source and differential amplifier whose current is drawn by the corresponding current source. For simplicity FIG. 6 shows only one feedback path and corresponding current source 612 with coefficient.

Current sources 611, 612 may be implemented with any of various kinds of current amplifier and/or current source circuits that are known in the art. Here, such circuits are composed of one or more transistors. The one or more transistors may demonstrate a change in mobility that the reference current source 601 is designed to compensate for consistent with the teachings provided herein.

Figure 7:
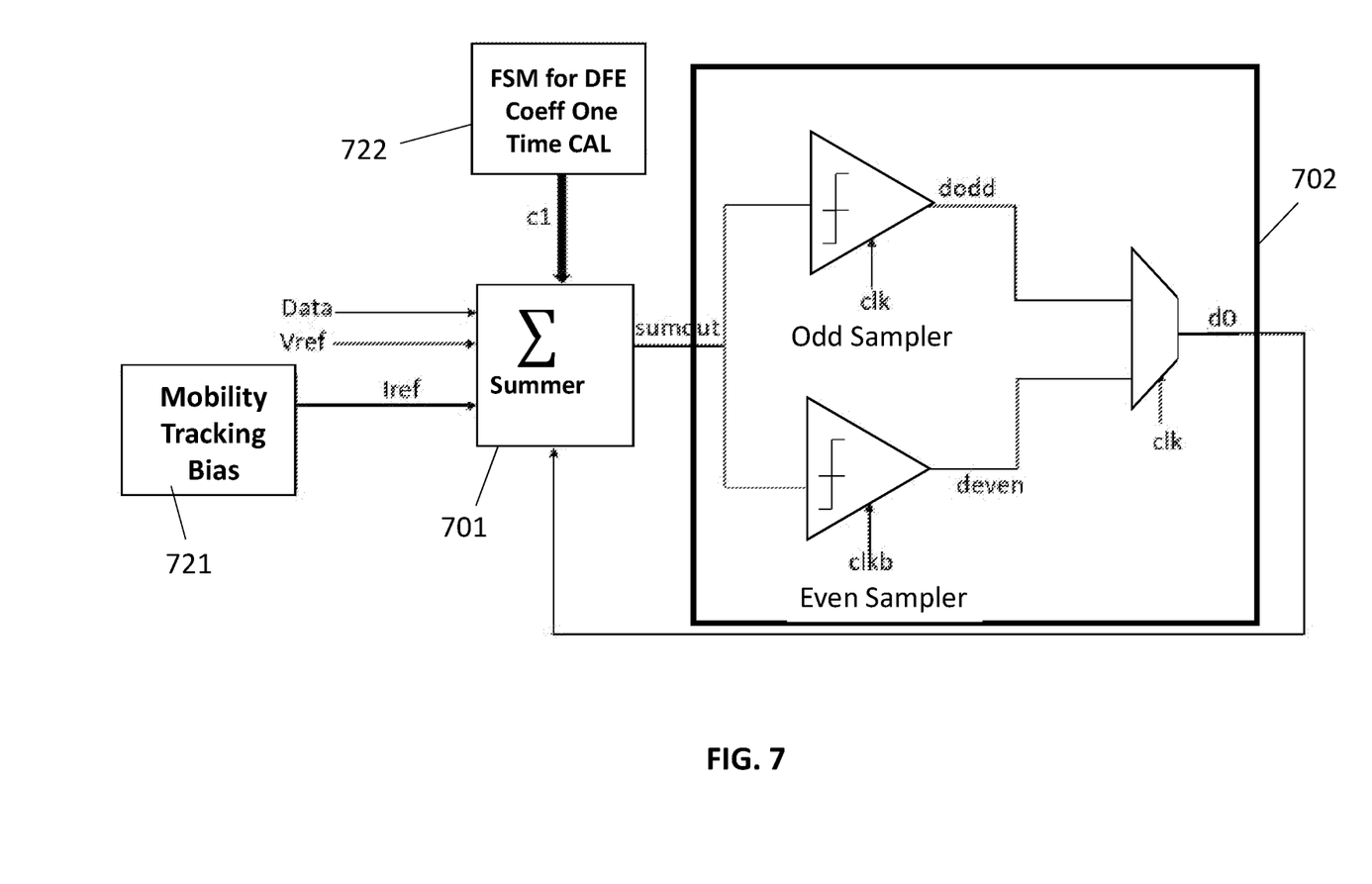
FIG. 7 shows a decision feedback analyzer circuit.

FIG. 7 shows a more detailed view of a DFE receiver that incorporates mobility tracking current sources in its summation circuit. Here, comparing FIG. 1 with FIG. 7, the summation circuit 701 of FIG. 7 corresponds to the summation circuit 101 of FIG. 1 and the decision circuit 702 of FIG. 7 corresponds to the decision circuit 102 of FIG. 1. The feedback path processing channel 103 of FIG. 1 is implemented with a coefficient setting, determined by circuit 722, that is programmed into the circuitry (e.g., current source of a differential pair) of the summation circuit 701 that receives the feedback signal from the decision circuit 702. Again, only the immediately prior symbol is feedback in the circuit of FIG. 7 but in other embodiments more than one prior symbol may be feedback. Here, circuitry 722 includes a finite state machine (FSM) that performs calibration training procedures on the DFE receiver during bring-up/power-on to determine the feedback coefficient. The mobility tracking bias circuit 721 corresponds to the reference current source 601 described above with respect to FIG. 6.

In various embodiments, the DFE receiver is particularly useful on very high speed single ended channels such as a data or address bus wire of a high speed memory bus such as a double data rate memory bus. Here, as is known in the art, the Joint Electron Device Engineering Council (JEDEC) provides industry standard double data rate (DDR) specifications. As such, the DFE receiver may be implemented in a memory interface that is compliant with a JEDEC DDR specification. Here, the inclusion of a DFE receiver circuit as described above into the memory interface may be particularly useful because of its ability to acceptably remove ISI even after extended runtime periods over which the receiver need not be re-calibrated because of its ability to internally compensate for, e.g., temperature changes that arise over the extended runtime period.

Figure 8:
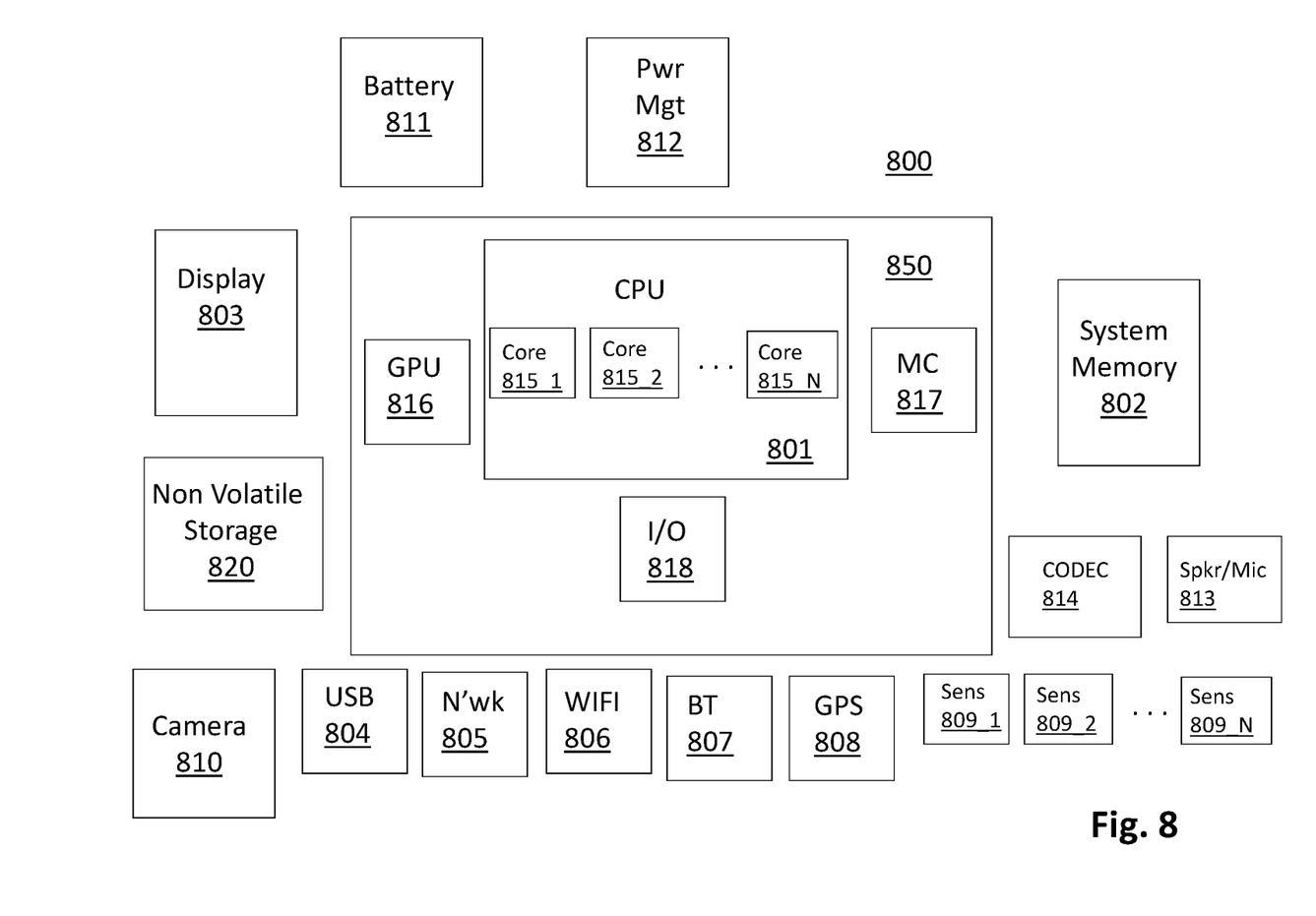
FIG. 8 shows a computing system.

FIG. 8 shows a depiction of an exemplary computing system 800 such as a personal computing system (e.g., desktop or laptop) or a mobile or handheld computing system such as a tablet device or smartphone, or, a larger computing system such as a server computing system.

As observed in FIG. 8, the basic computing system may include a central processing unit 801 (which may include, e.g., a plurality of general purpose processing cores and a main memory controller disposed on an applications processor or multi-core processor), system memory 802, a display 803 (e.g., touchscreen, flat-panel), a local wired point-to-point link (e.g., USB) interface 804, various network I/O functions 805 (such as an Ethernet interface and/or cellular modem subsystem), a wireless local area network (e.g., WiFi) interface 806, a wireless point-to-point link (e.g., Bluetooth) interface 807 and a Global Positioning System interface 808, various sensors 809_1 through 809_N (e.g., one or more of a gyroscope, an accelerometer, a magnetometer, a temperature sensor, a pressure sensor, a humidity sensor, etc.), a camera 810, a battery 811, a power management control unit 812, a speaker and microphone 813 and an audio coder/decoder 814.

An applications processor or multi-core processor 850 may include one or more general purpose processing cores 815 within its CPU 801, one or more graphical processing units 816, a memory management function 817 (e.g., a memory controller) and an I/O control function 818. The general purpose processing cores 815 typically execute the operating system and application software of the computing system. The graphics processing units 816 typically execute graphics intensive functions to, e.g., generate graphics information that is presented on the display 803. The memory control function 817, which may be referred to as a main memory controller or system memory controller, interfaces with the system memory 802. The system memory 802 may be a multi-level system memory.

Each of the touchscreen display 803, the communication interfaces 804-807, the GPS interface 808, the sensors 809, the camera 810, and the speaker/microphone codec 813, 814 all can be viewed as various forms of I/O (input and/or output) relative to the overall computing system including, where appropriate, an integrated peripheral device as well (e.g., the camera 810). Depending on implementation, various ones of these I/O components may be integrated on the applications processor/multi-core processor 850 or may be located off the die or outside the package of the applications processor/multi-core processor 850. Non volatile storage 820 may hold the BIOS and/or firmware of the computing system.

One or more various signal wires within the computing system, e.g., a data or address wire of a memory bus that couples the main memory controller to the system memory, may include a receiver that is implemented as decision feedback equalizer circuit that internally compensates for changes in electron mobility as described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
   a decision feedback equalizer circuit comprising a summation circuit, said summation circuit comprising an input differential pair comprising first and second transistors coupled to a first current source, said first current source to draw a first current through said first and second transistors, said decision feedback equalizer circuit comprising a circuit that provides a steady state triode region bias to each of a plurality of transistors arranged in a DC series circuit to adjust a reference current to compensate for a change in electron mobility of at least one transistor of said first current source, said first current source coupled to said circuit to receive said reference current to help establish said first current, said summation circuit comprising a feedback differential pair comprising third and fourth transistors coupled to a second current source, said second current source to draw a second current through said third and fourth transistors, said second current source coupled to said circuit to receive said reference current to help establish said second current.

2. The apparatus of claim 1 wherein said steady state triode region bias is to provide a reference voltage across said plurality of transistors.

3. The apparatus of claim 2 wherein said reference voltage is a fraction of said circuit's supply voltage.

4. The apparatus of claim 1 wherein the feedback differential pair is coupled to a feedback path that stems from an output of a decision circuit of said decision feedback equalizer circuit.

5. The apparatus of claim 4 wherein said feedback path has an associated coefficient that is provided through a register of the decision feedback equalizer circuit.

6. The apparatus of claim 1 wherein the feedback differential pair is coupled to a feedback path that stems from an output of a decision circuit of said decision feedback equalizer circuit.

7. The apparatus of claim 6 wherein said feedback path has an associated coefficient that is provided through a register of the decision feedback equalizer circuit.

8. An apparatus, comprising:
   a double data rate memory interface comprising a data signal wire;
   a decision feedback equalizer circuit coupled to said data signal wire to receive a data signal propagated on said data signal wire, said decision feedback equalizer circuit comprising a summation circuit, said summation circuit comprising an input differential pair comprising first and second transistors coupled to a first current source, said first current source to draw a first current through said first and second transistors, said decision feedback equalizer circuit comprising a circuit that provides a steady state triode region bias to each of a plurality of transistors arranged in a DC series circuit to adjust a reference current to compensate for a change in electron mobility of at least one transistor of said first current source, said first current source coupled to said circuit to receive said reference current to help establish said first current, said summation circuit comprising a feedback differential pair comprising third and fourth transistors coupled to a second current source, said second current source to draw a second current through said third and fourth transistors, said second current source coupled to said circuit to receive said reference current to help establish said second current.

9. The apparatus of claim 8 wherein said steady state triode region bias is to provide a reference voltage across said plurality of transistors.

10. The apparatus of claim 9 wherein said reference voltage is a fraction of said circuit's supply voltage.

11. A computing system, comprising:
    a plurality of processing cores;
    a system memory;
    a memory controller coupled between the plurality of processing cores and the system memory;
    a double data rate memory bus coupled between the system memory and the memory controller, the double data rate memory bus comprising a data signal wire;
    a decision feedback equalizer circuit coupled to said data signal wire to receive a data signal propagated on said data signal wire, said decision feedback equalizer circuit comprising a summation circuit, said summation circuit comprising an input differential pair comprising first and second transistors coupled to a first current source, said first current source to draw a first current through said first and second transistors, said decision feedback equalizer circuit comprising a circuit that provides a steady state triode region bias to each of a plurality of transistors arranged in a DC series circuit to adjust a reference current to compensate for a change in electron mobility of at least one transistor of said first current source, said first current source coupled to said circuit to receive said reference current to help establish said first current, said summation circuit comprising a feedback differential pair comprising third and fourth transistors coupled to a second current source, said second current source to draw a second current through said third and fourth transistors, said second current source coupled to said circuit to receive said reference current to help establish said second current.

12. The computing system of claim 11 wherein said steady state triode region bias is to provide a reference voltage across said plurality of transistors.

13. The computing system of claim 12 wherein said reference voltage is a fraction of said circuit's supply voltage.

14. The computing system of claim 11 wherein the feedback differential pair is coupled to a feedback path that stems from an output of a decision circuit of said decision feedback equalizer circuit.

15. An apparatus, comprising:
a circuit to provide a linear signal that tracks mobility change of at least one transistor within the circuit, the circuit comprising biasing circuitry to bias the at least one transistor in its triode region, the circuit coupled to a second circuit that is to receive the linear signal, the second circuit to linearly adjust a current reference signal based on the linear signal, said second circuit coupled to first and second current sources of first and second differential pairs respectively so that said current reference signal helps establish first and second currents respectively pulled through said first and second differential pairs by said first and second current sources, the first differential pair being an input differential pair of a summation circuit, said second differential pair being a feedback differential pair of said summation circuit.

* * * * *